US012644176B2

(12) United States Patent
Kim et al.

(10) Patent No.: US 12,644,176 B2
(45) Date of Patent: Jun. 2, 2026

(54) APPARATUS FOR MANUFACTURING DISPLAY DEVICE, MASK ASSEMBLY, AND METHOD OF MANUFACTURING THE DISPLAY DEVICE

(71) Applicant: Samsung Display Co., Ltd., Yongin-si (KR)

(72) Inventors: Jeongkuk Kim, Yongin-si (KR); Hwi Kim, Yongin-si (KR); Youngmin Moon, Yongin-si (KR); Areum Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 378 days.

(21) Appl. No.: 18/168,523

(22) Filed: Feb. 13, 2023

(65) Prior Publication Data

US 2024/0026526 A1 Jan. 25, 2024

(30) Foreign Application Priority Data

Jul. 21, 2022 (KR) ......................... 10-2022-0090620

(51) Int. Cl.
*C23C 16/04* (2006.01)
*H10K 59/12* (2023.01)
(52) U.S. Cl.
CPC ........ *C23C 16/042* (2013.01); *H10K 59/1201* (2023.02)
(58) Field of Classification Search
CPC ..................................................... C23C 14/02
See application file for complete search history.

(56) References Cited

U.S. PATENT DOCUMENTS

| | | | | |
|---|---|---|---|---|
| 8,550,032 | B2 | 10/2013 | Park | |
| 8,881,676 | B2* | 11/2014 | Hong | ..................... C23C 14/12 |
| | | | | 118/504 |
| 9,141,001 | B2 | 9/2015 | Kim | |
| 2012/0266813 | A1* | 10/2012 | Hong | .................. H10K 71/166 |
| | | | | 118/504 |
| 2020/0101513 | A1* | 4/2020 | Luo | ....................... B21D 11/02 |

(Continued)

FOREIGN PATENT DOCUMENTS

| | | | | |
|---|---|---|---|---|
| CN | 115704082 A | * | 2/2023 | .......... C23C 14/042 |
| KR | 10-1107159 B1 | | 1/2012 | |
| KR | 10-2013-0131732 A | | 12/2013 | |

(Continued)

OTHER PUBLICATIONS

Li et al. CN 115704082 translation. Feb. 2023 (Year: 2023).*

*Primary Examiner* — Cachet I Proctor
(74) *Attorney, Agent, or Firm* — Womble Bond Dickinson (US) LLP

(57) ABSTRACT

An apparatus for manufacturing a display device including a mask assembly including a mask frame and a mask sheet, the mask frame including an opening area and the mask sheet covering the opening area, wherein the mask sheet includes a body fixed to the mask frame, an opening arranged in the body, the opening through which a deposition material passes, and a corrector arranged in the body and configured to correct deformation of the opening, and the corrector includes a correction hole penetrating the body and a correction member crossing at least a portion of the correction hole and being cuttably connected to the body.

9 Claims, 11 Drawing Sheets

(56)  References Cited

U.S. PATENT DOCUMENTS

| | | | |
|---|---|---|---|
| 2021/0265396 A1* | 8/2021 | Kim ..................... | H10K 59/121 |
| 2022/0131075 A1* | 4/2022 | Lee ..................... | H10K 71/164 |

FOREIGN PATENT DOCUMENTS

| | | |
|---|---|---|
| KR | 10-1820020 B1 | 1/2018 |
| KR | 10-1986333 B1 | 6/2019 |
| KR | 10-2000548 B1 | 7/2019 |
| KR | 10-2021-0064996 A | 6/2021 |
| KR | 10-2316167 B1 | 10/2021 |

* cited by examiner

APPARATUS FOR MANUFACTURING DISPLAY DEVICE, MASK ASSEMBLY, AND METHOD OF MANUFACTURING THE DISPLAY DEVICE

CROSS-REFERENCE TO RELATED APPLICATION

This application claims priority to and the benefit of Korean Patent Application No. 10-2022-0090620, filed on Jul. 21, 2022, in the Korean Intellectual Property Office, the disclosure of which is incorporated by reference herein in its entirety.

BACKGROUND

1. Field

Embodiments of the disclosure relate to an apparatus and a method, and for example, to an apparatus for manufacturing a display device, a mask assembly, and a method of manufacturing the display device.

2. Description of the Related Art

Recently, electronic devices are widely utilized. Electronic devices such as mobile electronic devices and fixed electronic devices are being utilized in one or more suitable ways, and these electronic devices include display devices which may provide visual information such as images or videos to support one or more suitable functions.

A display device, which is a device configured to visually display data, is formed by deposition of one or more suitable layers such as an organic layer, a metal layer, and/or the like. Deposition materials may be deposited to form a plurality of layers of a display device. For example, deposition materials are sprayed from deposition sources and deposited on a substrate through a mask assembly. In this case, when the mask sheet is deformed or interruption occurs between a mask sheet and a shielding stick, deposition materials are not deposited onto desired or suitable positions on the substrate, and thus, the quality of deposition is degraded.

The related art described above may include technical information possessed by the applicant for the derivation of the disclosure or acquired during the derivation of the disclosure, and is not necessarily suitable technology disclosed to the public prior to the application of the disclosure.

SUMMARY

Aspects of embodiments are directed toward an apparatus for manufacturing a display device, a mask assembly, and a method of manufacturing the display device, by which deformation of an opening occurring in a process of fixing a mask sheet to a mask frame may be corrected.

Additional aspects will be set forth in part in the description which follows and, in part, will be apparent from the description, or may be learned by practice of the presented embodiments of the disclosure.

According to one or more embodiments, an apparatus for manufacturing a display device includes a mask assembly including a mask frame and a mask sheet, the mask frame including an opening area and the mask frame covering the opening area, wherein the mask sheet includes a body fixed to the mask frame, an opening arranged in the body, and through which a deposition material passes, and a corrector arranged in the body and configured to correct deformation of the opening, wherein the corrector includes a correction hole penetrating the body and a correction member crossing at least a portion of the correction hole and being cuttably connected to the body.

According to one or more embodiments, the correction hole includes a first hole, a second hole extending in a first direction from the first hole, and a third hole extending in a second direction from the first hole.

According to one or more embodiments, the first direction and the second direction cross with each other.

According to one or more embodiments, the correction member includes a first correction member crossing the second hole and a second correction member crossing the third hole.

According to one or more embodiments, a plane of the correction hole has a cross shape.

According to one or more embodiments, a thickness of the correction member may be smaller than a thickness of the body.

According to one or more embodiments, the opening is provided as a plurality of openings, the plurality of openings are arranged in a first opening direction and a second opening direction crossing with the first opening direction, and at least a portion of the corrector is arranged in an area among four adjacent openings from among the plurality of openings.

According to one or another embodiment, the apparatus for manufacturing the display device includes a mask frame including an opening area and a mask sheet covering the opening area, wherein the mask sheet includes a body fixed to the mask frame in a stretched state, an opening arranged in the body, the opening through which a deposition material passes, and a corrector arranged in the body and is at least partially cuttable to correct deformation of the opening that is caused as the body is stretched.

According to one or more embodiment, the corrector may include a correction hole penetrating the body and a correction member covering at least a portion of the correction hole and being cuttably connected to the body.

According to one or more embodiments, a thickness of the correction member may be smaller than a thickness of the body.

According to one or more embodiments, the opening is provided as a plurality of openings, the plurality of openings are arranged in a first opening direction and a second opening direction crossing the first opening direction, and at least a portion of the corrector is arranged in an area among four adjacent openings from among the plurality of openings.

According to one or more embodiments, the method of manufacturing the display device includes manufacturing a mask assembly, depositing a deposition material on a display substrate through the mask assembly, and the manufacturing of the mask assembly includes manufacturing a mask sheet by arranging an opening and a corrector in a body, fixing the mask sheet to the mask frame by stretching the body, and correcting of the deformation of the opening by the corrector.

According to one or more embodiments, the correcting of the deformation of the opening utilizing the corrector includes cutting at least a portion of the corrector.

According to one or more embodiments, the corrector includes a correction hole penetrating the body and a correction member crossing at least a portion of the correction hole and being cuttably connected to the body.

According to one or more embodiments, the correction hole includes a first hole, a second hole extending in a first direction from the first hole, and a third hole extending in a second direction from the first hole.

According to one or more embodiments, the first direction and the second direction cross with each other.

According to one or more embodiments, the correction member includes a first correction member crossing the second hole and a second correction member crossing the third hole.

According to one or more embodiments, a plane of the correction hole has a cross shape.

According to one or more embodiments, a thickness of the correction member may be smaller than a thickness of the body.

According to one or more embodiments, the opening is provided as a plurality of openings, the plurality of openings are arranged in a first opening direction and a second opening direction crossing with the first opening direction, and at least a portion of the corrector is arranged in an area among four adjacent openings from among the plurality of openings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
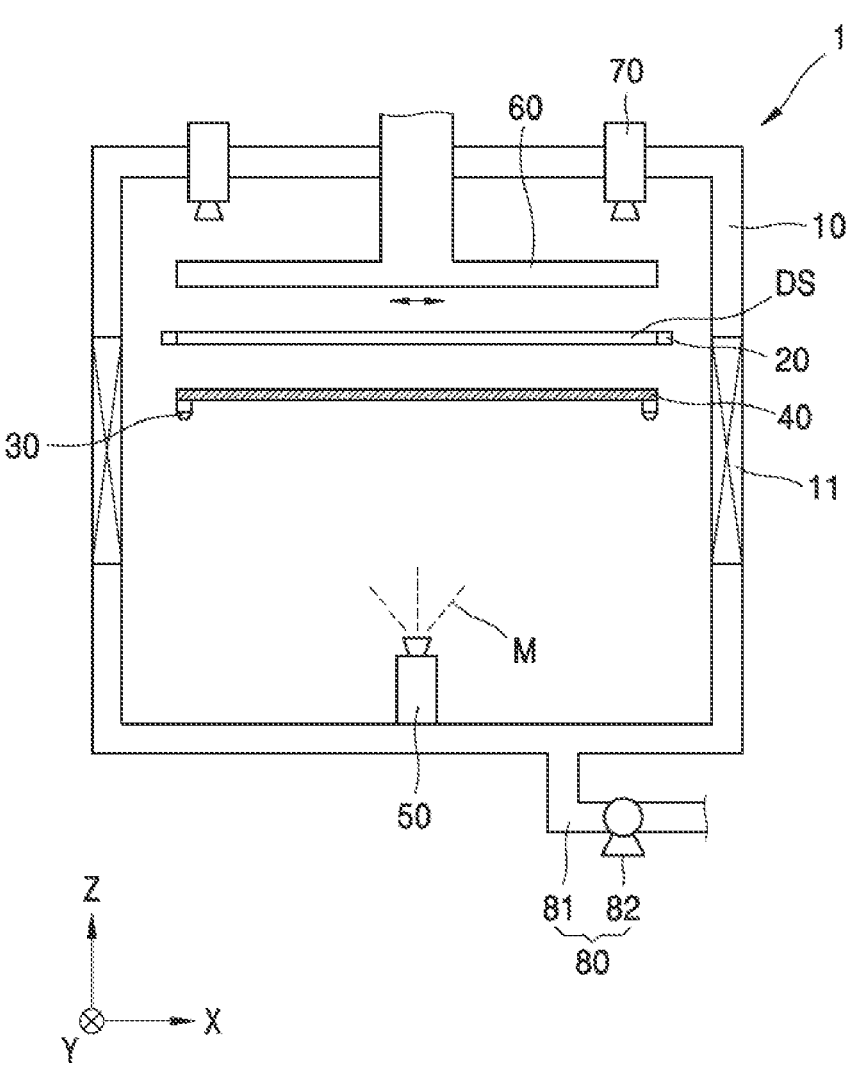
FIG. 1 is a cross-sectional view of an apparatus for manufacturing a display device, according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described, by referring to the drawings, to explain aspects of the present description. As utilized herein, the term "and/or" includes any and all combinations of one or more of the associated listed items. Throughout the disclosure, the expression "at least one of a, b or c", "at least one of a-c", "at least one of a to c", "at least one of a, b, and/or c", etc., indicates only a, only b, only c, both (e.g., simultaneously) a and b, both (e.g., simultaneously) a and c, both (e.g., simultaneously) b and c, all of a, b, and c, or variations thereof.

In the present specification, "including A or B", "A and/or B", etc., represents A or B, or A and B.

Hereinafter, embodiments of the disclosure will be described in more detail with reference to the accompanying drawings. In the descriptions with reference to the drawings, same reference numerals will be given to same or corresponding components, and repeated descriptions thereof will not be provided.

In the following embodiments, terms such as "first," "second" are not utilized in a limited sense but utilized to distinguish one component from others.

In the following embodiment, unless explicitly intended otherwise, singular forms also encompass plural forms.

In the following embodiments, terms such as "comprise", "include," and "have" indicate presence of features or components disclosed in the specification, and are not to preclude possibility of addition of one or more other features or components.

In the following embodiments, when a portion such as a film, an area, or a component is on or above another portion, the portion may be directly on the other portion, alternatively, another film, area, component and/or the like may be between the portion and the other portion.

For convenience of explanation, sizes of components in the drawings may be exaggerated or reduced. For example, sizes and thicknesses of components shown in the drawings are arbitrarily shown for convenience of explanation, and therefore, the disclosure is not necessarily limited to the drawing.

In the following embodiment, the X axis (X), the Y axis (Y), and the Z axis (Z) are not limited to three axes on an orthogonal coordinate system, and may be interpreted as wider meanings including the three axes on the orthogonal coordinate system. For example, the X axis, the Y axis, and the X axis may be orthogonal to one another, but may also refer to different directions that are not orthogonal to one another.

When an embodiment may be differently embodied, a specific order may be performed different from a described order. For example, two processes consequently described may be substantially concurrently (e.g., simultaneously) performed, and may be performed in an order opposite to the described order.

In this specification, when an element (or region, layer, part, etc.) is referred to as being "on", "connected to", or "coupled to", or "adjacent to" another element, it refers to that it may be directly placed on/connected to/coupled to other components, or one or more third components may be arranged between them. That is, it should be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art. "About" or "substantially", as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" or "substantially" may mean within one or more standard deviations, or within ±30%, 20%, 10%, 5% of the stated value.

The display apparatus and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

FIG. 1 is a cross-sectional view of an apparatus for manufacturing a display device, according to an embodiment.

Referring to FIG. 1, the apparatus 1 for manufacturing the display device may include a chamber 10, a first supporter 20, a second supporter 30, a mask assembly 40, a deposition source 50, a magnetic force unit 60, a vision unit 70, and a pressure adjuster 80.

The chamber 10 may include a space formed therein, and may accommodate a display substrate DS and the mask assembly 40. In this case, a portion of the chamber 10 may be open, and a gate valve 11 may be placed in the open portion of the chamber 10. In this case, the open portion of the chamber 10 may be open or closed according to operations of the gate valve 11.

The first supporter 20 may support the display substrate DS. In this case, the first supporter 20 may have the form of a plate fixed in the chamber 10. As another embodiment, the display substrate DS may be mounted above the first supporter 20, and the first supporter 20 may have the form of a shuttle that may linearly move in the chamber 10. As another embodiment, to be fixed to the chamber 10 or movable in the chamber 10, the first supporter 20 may also include an electrostatic chuck or an adhesion chuck arranged in the chamber 10.

The second supporter 30 may support the mask assembly 40. In this case, the second supporter 30 may be in the chamber 10. The second supporter 30 may finely adjust a position of the mask assembly 40. In this case, the second supporter 30 may include separate drivers or aligning units such that the mask assembly 40 may be moved into different directions.

As another embodiment, the second supporter 30 may also have the form of a shuttle. In this case, the mask assembly 40 is mounted on the second supporter 30, and the second supporter 30 may transport the mask assembly 40. For example, the second supporter 30 may move outside the chamber 10 and enter from outside the chamber 10 into the chamber 10 after the mask assembly 40 is mounted on the second supporter 30.

In the aforementioned case, the first supporter 20 and the second supporter 30 may be integrally formed. In this case, the first supporter 20 and the second supporter 30 may include movable shuttles. In this case, the first supporter 20 and the second supporter 30 include a structure to fix the mask assembly 40 and the display substrate DS in a state where the display substrate DS is mounted on the mask assembly 40, and may have the display substrate DS and the mask assembly 40 concurrently (e.g., simultaneously) perform linear movement.

However, for convenience of explanation, a case in which the first supporter 20 and the second supporter 30 are separately formed and arranged at different positions and a case in which the first supporter 20 and the second supporter 30 are arranged in the chamber 10 will be described in more detail.

The mask assembly 40 may face the display substrate DS in the chamber 10. A deposition material M may pass through the mask assembly 40 and be deposited on the display substrate DS.

The deposition source 50 may be arranged to face the mask assembly 40, and may supply the deposition material M such that the deposition material M passes through a deposition area EA of the mask assembly 40 and is deposited on the display substrate DS. Here, the deposition source 50 may vaporize or sublimate the deposition material M by heating the deposition material M. The deposition source 50 may be fixed in the chamber 10, or may be arranged in the chamber 10 to perform linear movement in a direction.

The magnetic force unit 60 may be arranged in the chamber 10 to face the display substrate DS and/or the mask assembly 40. Here, the magnetic force unit 60 may apply a magnetic force to the mask assembly 40, to thereby apply a force to the mask assembly 40 toward the display substrate DS. For example, the magnetic force unit 60 may prevent or reduce loosening of the mask sheet 44 and may bring the mask sheet 44 adjacent to the display substrate DS. In some embodiments, the magnetic force unit 60 may constantly maintain a gap between the mask sheet 44 and the display substrate DS.

The vision unit 70 may be arranged in the chamber 10, and may capture positions of the display substrate DS and the mask assembly 40. Here, the vision unit 70 may include a camera configured to capture the display substrate DS and the mask assembly 40. Based on images captured by the vision unit 70, the positions of the display substrate DS and the mask assembly 40 may be identified, and deformation of the mask assembly 40 may be recognized. In some embodiments, based on the images, the position of the display substrate DS in the first supporter 20 may be finely adjusted, or the position of the mask assembly 40 in the second supporter 30 may be finely adjusted. However, hereinafter, a case in which the positions of the display substrate DS and the mask assembly 40 are aligned by finely adjusting the position of the mask assembly 40 in the second supporter 30 will be described.

The pressure adjuster 80 may be connected to the chamber 10 and adjust a pressure in the chamber 10. For example, the pressure adjuster 80 may adjust the pressure in the chamber 10 to be identical or similar to air pressure. In some embodiments, the pressure adjuster 80 may adjust the pressure in the chamber 10 to be identical or similar to a vacuum state.

The pressure adjuster 80 may include a connection pipe 81 connected to the chamber 10 and a pump 82 provided in the connection pipe 81. Here, according to operations of the pump 82, external air may be introduced through the connection pipe 81, or air in the chamber 10 may be guided outside through the connection pipe 81.

In a method of manufacturing a display device by utilizing the apparatus 1 for manufacturing for the display device as described above, first, the display substrate DS may be prepared.

The pressure adjuster 80 may maintain the inside of the chamber 10 to be identical or similar to the air pressure, and the open portion of the chamber 10 may be open by operation of the gate valve 11.

Next, the display substrate DS may be mounted into the chamber 10 from outside the chamber 10. Here, the display substrate DS may be mounted into the chamber 10 in one or more suitable manners. For example, the display substrate DS may be mounted into the chamber 10 from outside the chamber 10 through a robot arm and/or the like arranged outside the chamber 10. As another embodiment, when the first supporter 20 is formed into a shuttle, the first supporter 20 may be drawn outside the chamber 10 from inside the chamber 10, the display substrate DS may be mounted on the first supporter 20 by utilizing a separate robot arm and/or the like arranged outside the chamber 10, and the first chamber 20 may be mounted into the chamber 10 from outside the chamber 20.

As described above, the mask assembly 40 may be arranged in the chamber 10. As another embodiment, the mask assembly 40 may be mounted from outside the chamber 10 into the chamber 10, like or similar to the display substrate DS.

When the display substrate DS is mounted into the chamber 10, the display substrate DS may settle on the first supporter 20. In this case, the vision unit 70 may capture the positions of the display substrate DS and the mask assembly 40. The positions of the display substrate DS and the mask assembly 40 may be identified based on the images captured by the vision unit 70. Here, the apparatus 1 for manufacturing the display device may include a separate controller to identify the positions of the display substrate DS and the mask assembly 40.

When the positions of the display substrate DS and the mask assembly 40 are identified, the second supporter 30 may finely adjust the position of the mask assembly 40.

Thereafter, the deposition source 50 may operate to provide the deposition material M to the mask assembly 40, and the deposition material M passed through a plurality of pattern holes in the mask sheet 44 may be deposited on the display substrate DS. In this case, the deposition source 50 may move parallel to the display substrate DS and the mask assembly 40, or alternatively, the display substrate DS and the mask assembly 40 may move parallel to the deposition source 50. For example, the deposition source 50 may move relative to the display substrate DS and the mask assembly 40. Here, the pump 82 may maintain the pressure in the chamber 10 to be identical or similar to vacuum by absorbing the air in the chamber 10 and discharging the air to the outside.

Figure 2:
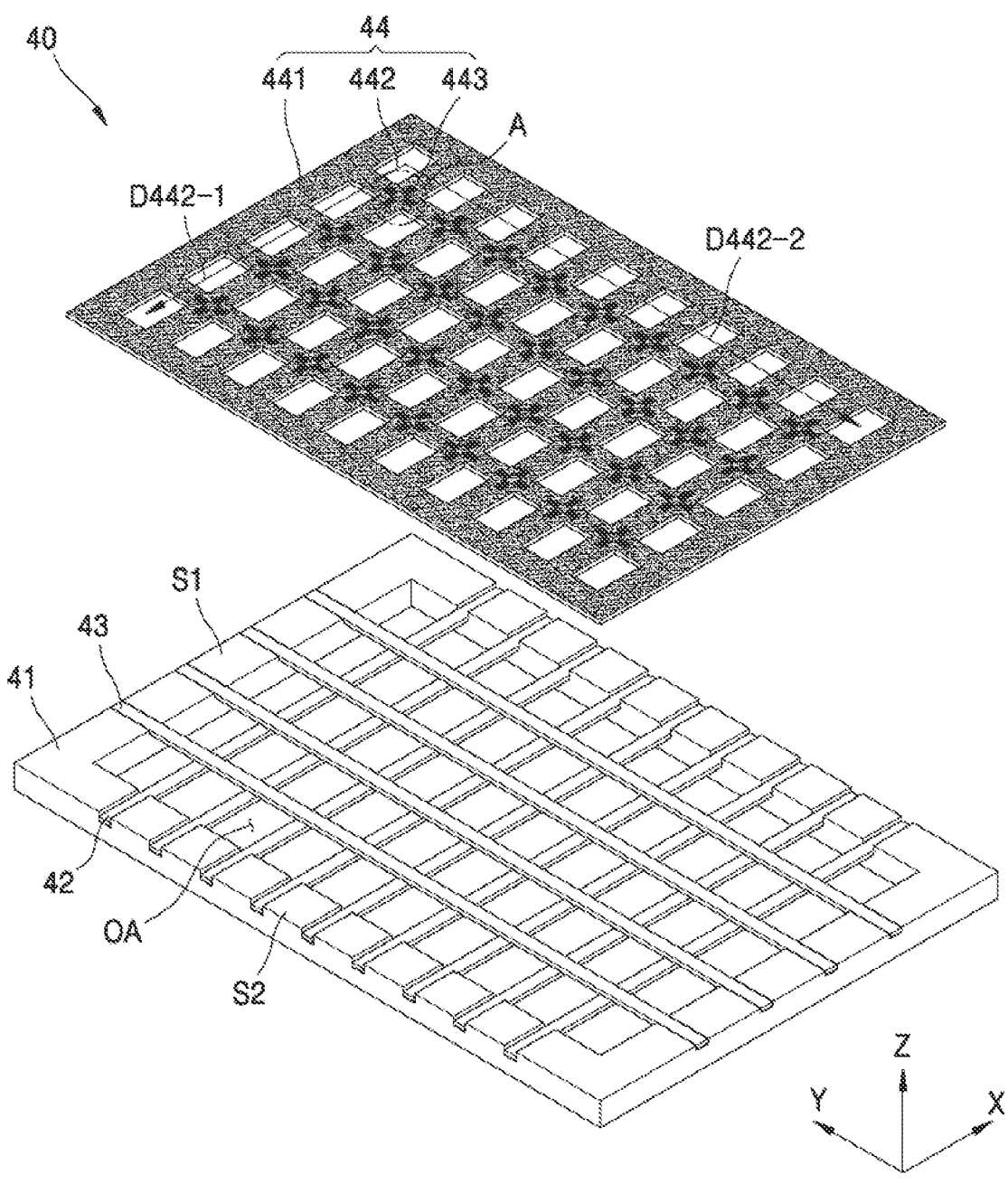
FIG. 2 is a schematic perspective view of a mask assembly according to an embodiment.

FIG. 2 is a schematic perspective view of the mask assembly according to an embodiment.

Referring to FIG. 2, the mask assembly 40 may include a mask frame 41, a first support stick 42, a second support stick 43, and a mask sheet 44.

The mask frame 41 may be formed by connection of a plurality of sides, and may include an opening area OA defined by the plurality of sides. For example, the opening area OA may be surrounded by the plurality of sides, and may penetrate a center of the mask frame 41.

In an embodiment, the mask frame 41 may include a square frame. However, shapes of the mask frame 41 are not limited thereto, and may include one or more suitable polygon shapes. Hereinafter, for convenience of explanation, a case in which the mask frame 41 is a square frame will be mainly described.

When the mask frame 41 is a square frame, the plurality of sides may include a pair of first sides S1 extending in an X axis direction and a pair of second sides S2 extending in a Y axis direction. The pair of first sides S1 includes two first sides S1 facing each other, the pair of second sides S2 includes two second sides S2 facing each other, and the first side S1 and the second side S2 may be connected to each other. In an embodiment, the first side S1 may include a short side, and the second side S2 may include a long side. However, the embodiment is not limited thereto: for example, the first side S1 may include a long side and the second side S2 may include a short side, or alternatively, the first side S1 and the second side S2 may have a same length. Hereinafter, for convenience of explanation, a case in which the first side S1 includes a short side and the second side S2 includes a long side will be described.

The first support stick 42 may be arranged to extend in the X axis direction across the opening area OA. For example, a groove for accommodating two end portions of the first support stick 42 may be arranged in the mask frame 41. However, this is merely an example, a separate groove may be not arranged in the mask frame 41, and the first support stick 42 may be arranged on the mask frame 41. The first support stick 42 may be arranged between the plurality of mask frames 41 to block or reduce the deposition material M from passing through two mask frames 41 adjacent each other. A plurality of the first support sticks 42 may be apart from one another in the Y axis direction and parallel to one another.

The second support stick 43 may be arranged to extend in the Y axis direction across the opening area OA. In the opening area OA, the second support stick 43 may cross with the first support stick 42 and may be above the first support stick 42. For example, a groove for accommodating two end portions of the second support stick 43 may be arranged in the mask frame 41. However, this is merely an example, a separate groove may be not arranged in the mask frame 41, and the second support stick 43 may be arranged on the mask frame 41. The second support stick 43 may prevent or reduce loosening of the mask sheet 44 by supporting the mask sheet 44 in the opening area OA.

The mask sheet 44 may cover the opening area OA of the mask frame 41. The mask sheet 44 may include a body 441, an opening 442, and a corrector 443.

The body 441 forms an appearance of the mask sheet 44, and may be fixed to the mask frame 41 in a stretched state. For example, a circumference of the body 441 may be fixed to the mask frame 41 by fusing method. However, this is merely an example, and a method of fixing the body 441 to the mask frame 41 is not limited thereto. The body 441 may have a shape corresponding to a shape of the opening area OA of the mask frame 41. For example, as shown in FIG. 2, when the shape of the opening area OA is rectangular, the body 441 may have a rectangular shape. In this structure, the body 441 in a stretched state may cover the opening area OA of the mask frame 41.

The opening portion 442 may be in the body 441 and may penetrate the body 441 to allow the deposition material M material to pass through. Although FIG. 2 illustrates an example in which the shape of the opening 442 is rectangular, the shape of the opening 442 is not limited thereto, and it will be understood that the opening 442 may be formed into a circular or polygonal shape according to the purpose and use thereof.

A plurality of the openings 442 may be provided, and the plurality of openings 442 may be arranged in a plurality of columns and rows apart from each other in a first opening direction D442-1 and a second opening direction D442-2 crossing with the first opening direction D442-1. For example, as shown in FIG. 2, the first opening direction D442-1 may include the X axis direction, and the second opening direction D442-2 may include the Y axis direction. In this structure, the plurality of openings 442 may be arranged in the form of a grid. Although FIG. 2 illustrates that the plurality of openings 442 are arranged in ten columns and five rows, this is merely an example, and the arrangement of the opening 442 is not limited thereto.

The shape of the opening 442 may be deformed in a process during which the body 441 is stretched. For example, in FIG. 2 illustrating a state of the body 441 before being stretched, the shape of the opening 442 remains as a rectangle. However, in the process during which the body 441 is stretched, the shape of the opening 442 may be changed into a shape other than the rectangle. Details of deformation in the shape of the opening 442 will be described later with reference to FIGS. 5A and 5B.

The corrector 443 may be in the body 441, and may be configured to correct the deformation in the shape of the opening 442 as the body 441 is stretched. Details of a method by which the corrector 443 corrects the deformation of the opening 442 will be described later with reference to FIGS. 5A and 5B.

Figure 3A:
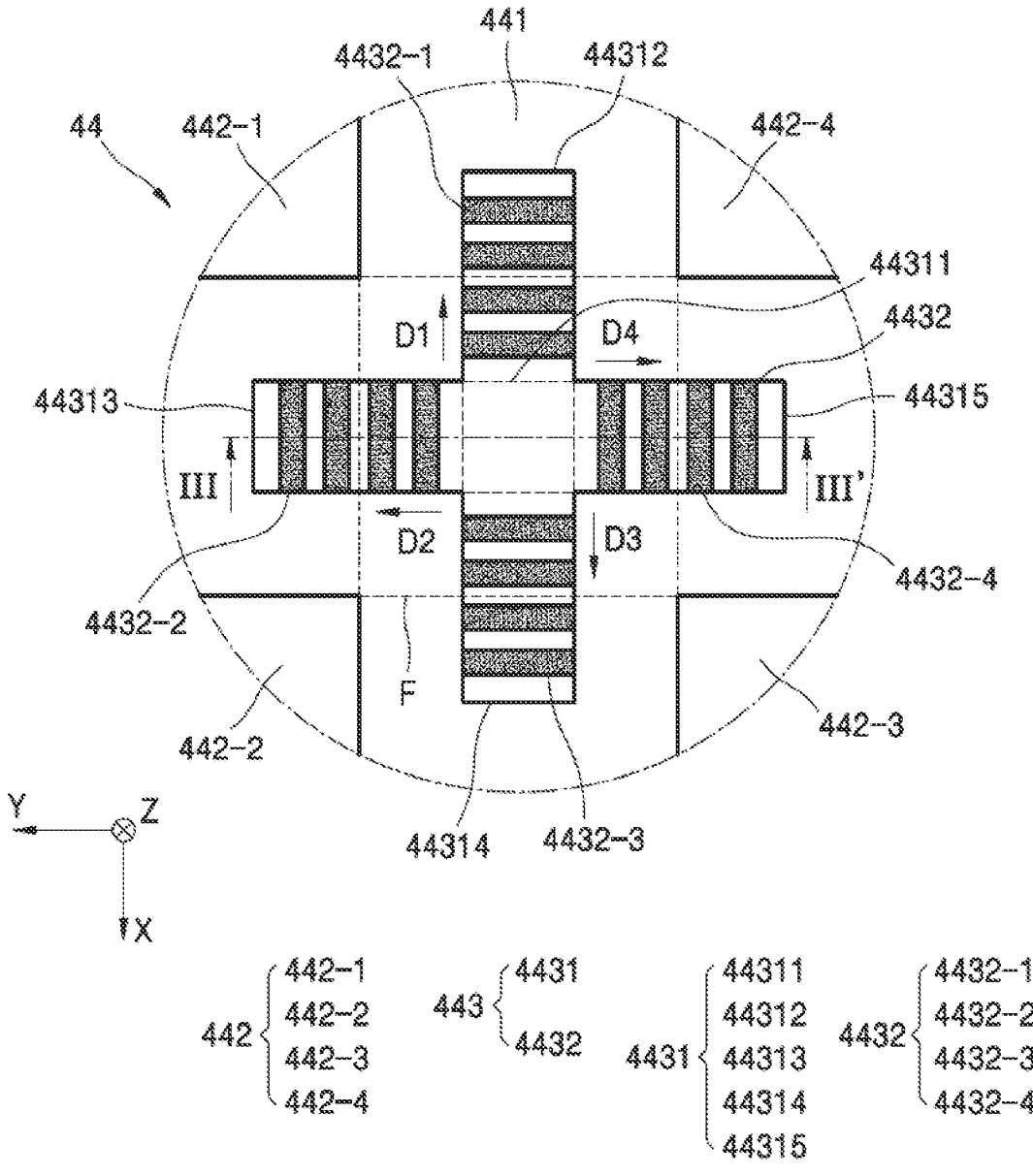
FIG. 3A is an enlarged view of portion A shown in FIG. 2, according to an embodiment.
Figure 3B:
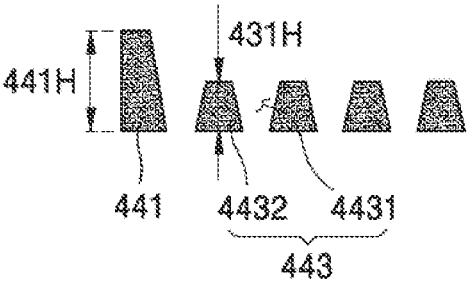
FIG. 3B is a cross-sectional view of portion III-III shown in FIG. 3A, according to an embodiment.
Figure 3B:
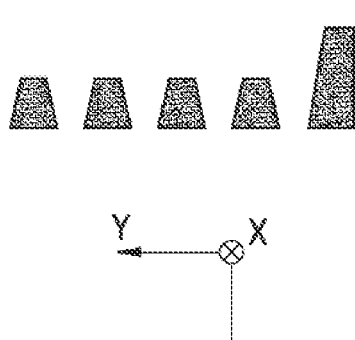

FIG. 3A is an enlarged view of portion A shown in FIG. 2 according to an embodiment, and FIG. 3B is a cross-sectional view of portion III-III' shown in FIG. 3A according to an embodiment.

Referring to FIGS. 3A and 3B, the corrector 443 may include a correction hole 4431 and a correction member 4432.

The correction hole 4431 may be in the body 441 and penetrate the body 441. The correction hole 4431 may include: a first hole 44311, a second hole 44312 extending in a first direction D1 from the first hole 44311; a third hole 44313 extending in a second direction D2 from the first hole 44311; a fourth hole 44314 extending in a third direction D3 from the first hole 44311; and a fifth hole 44315 extending in a fourth direction from the first hole 44311.

At least two of the first direction D1, the second direction D2, the third direction D3, and the fourth direction D4 may be directions crossing with each other. For example, the first direction D1 and the third direction D3 may be substantially parallel to each other; the second direction D2 and the fourth direction D4 may be substantially parallel to each other; and the first direction D1 and the second direction D2 may be substantially perpendicular to each other. In this structure, as shown in FIG. 3A, a plane of the correction hole 4431 may have a cross shape. Accordingly, the corrector 443 may correct the deformation of the opening 442 in one or more suitable directions. Although FIG. 3A illustrates planes of the first hole 44311, the second hole 44312, the third hole 44313, the fourth hole 44314, and the fifth hole 44315 as having a square shape, this is merely an embodiment, and the shape of the correction hole 4431 is not limited thereto.

The correction member 4432 may cross at least a portion of the correction hole 4431 and may be cuttably connected to the body 441. A plurality of the correction member 4432 may be provided. For example, the correction member 4432 may include: a first correction member 4432-1 crossing over the second hole 44312; a second correction member 4432-2 crossing over the third hole 44313; a third correction member 4432-3 crossing over the fourth hole 44314; and a fourth correction member 4432-4 crossing over the fifth hole 44315. In this structure, the correction member 4432 may cross each joint of the correction hole 4431 having a cross shape. Although FIG. 3A illustrates the shape of the correction member 4432 as a square, this is merely an example, and the shape of the correction member 4432 is not limited thereto.

At least one of the first correction member 4432-1, the second correction member 4432-2, the third correction member 4432-3, and the fourth correction member 4432-4 may be provided in a plurality. In the process of correcting the deformation of the opening 442 by the corrector 443, the number of correction members 4432 being cut may be adjusted. In this structure, the correction member 4432 may be cut to correspond to deformation of the opening 442 into one or more suitable shapes. Although FIG. 3A illustrates that the number of each of the first correction member 4432-1, the second correction member 4432-2, the third correction member 4432-3, and the fourth correction member 4432-4 is four, this is merely an example, and the number of correction member 4432 is not limited thereto.

At least a portion of the corrector 443 may be arranged in an area F among four openings 442 adjacent one another from among the plurality of openings 442. The four openings 442 adjacent to one another will be referred to as a first opening 442-1, a second opening 442-2, a third opening 442-3, and a fourth opening 442-4. Here, the area F among the four openings 442 adjacent to one another indicates an area formed by connecting corners adjacent to the corrector 443 from the four openings 442 adjacent to one another, utilizing virtual lines. In this structure, one corrector 443 may correct deformation of at least four openings 442. For example, in FIG. 3A, the corrector 443 may correct deformation of the first opening 442-1, the second opening 442-2, the third opening 442-3, and the fourth opening 442-4.

The corrector 443 may be arranged in a center of the area F among the four openings 442 adjacent to one another. For example, distances between the corrector 443 and the four openings 442 adjacent to one another may be equal to one another. For example, a distance from the second hole 44312 between the first opening 442-1 and the fourth opening 442-4, a distance from the third hole 44313 between the first opening 442-1 and the second opening 442-2, a distance from the fourth hole 44314 between the second opening 442-2 and the third opening 442-3, and a distance from the fifth hole 44315 between the third opening 442-3 and the fourth opening 442-4 may be identical. Accordingly, one corrector 443 may symmetrically and concurrently (e.g., simultaneously) correct deformation of the plurality of openings 442.

A thickness 443H of the correction member 4432 may be smaller than a thickness 441H of the body 441. For example, as shown in FIG. 3B, a surface (for example, a surface toward a +Z axis direction) of the body 441 facing a display substrate (e.g., the display substrate DS shown in FIG. 1) and a surface (for example, a surface toward the +Z axis direction) of the correction member 4432 facing the display substrate DS may be coplanar with each other, and a step may be formed between a surface (for example, a surface toward a –Z axis direction) of the body 441 facing a deposition source (e.g., the deposition source 50 shown in FIG. 1) and a surface (e.g., a surface facing the –Z axis direction) of the correction member 4432 toward the deposition source 50. In this structure, in a process of correcting the deformation of the opening 442 by the corrector 443, the correction member 4432 may be easily cut. However, the shape of the corrector 443 shown in FIG. 3B is merely an example, and the shape of the corrector 443 is not limited thereto. For example, a step may also be formed between the surface (e.g., the surface toward the +Z axis direction) of the body 441 toward the display substrate DS and the surface (e.g., the surface toward the +Z axis direction) of the correction member 4432 toward the display substrate DS.

FIGS. 4A to 5B are top-plan views of a portion of the mask sheet according to an embodiment. Referring to FIGS. 4A to 5B, the corrector 443 may correct the deformation of the opening 442.

Figure 4A:
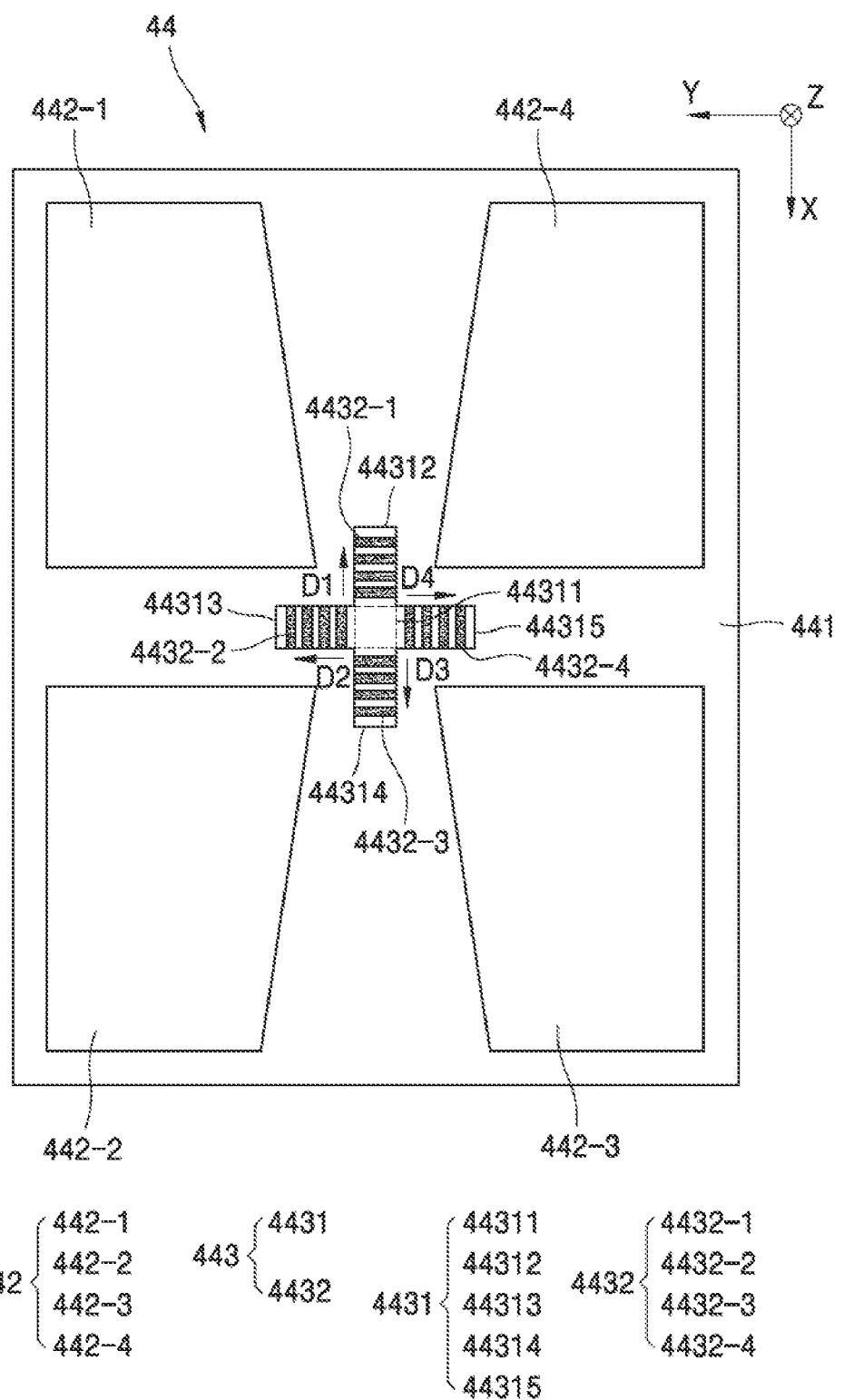
FIGS. 4A-5B are top-plan views of a portion of a mask sheet according to an embodiment.

Referring to FIG. 4A, the deformation of the opening 442 may occur in the state where the body 441 is stretched. For example, the opening 442 may be deformed such that a portion of the opening 442 adjacent to the corrector 443 inclines toward the opening 442. For example, the opening 442 may be deformed such that a corner of the first opening 442-1 adjacent to the corrector 443 and a corner of the second opening 442-2 adjacent to the corrector 443 may incline in the fourth direction D4 toward the opening 442 and a corner of the third opening 442-3 adjacent to the corrector 443 and a corner of the fourth direction D4 adjacent to the corrector 443 each incline in the second direction D2 toward the opening 442.

Figure 4B:
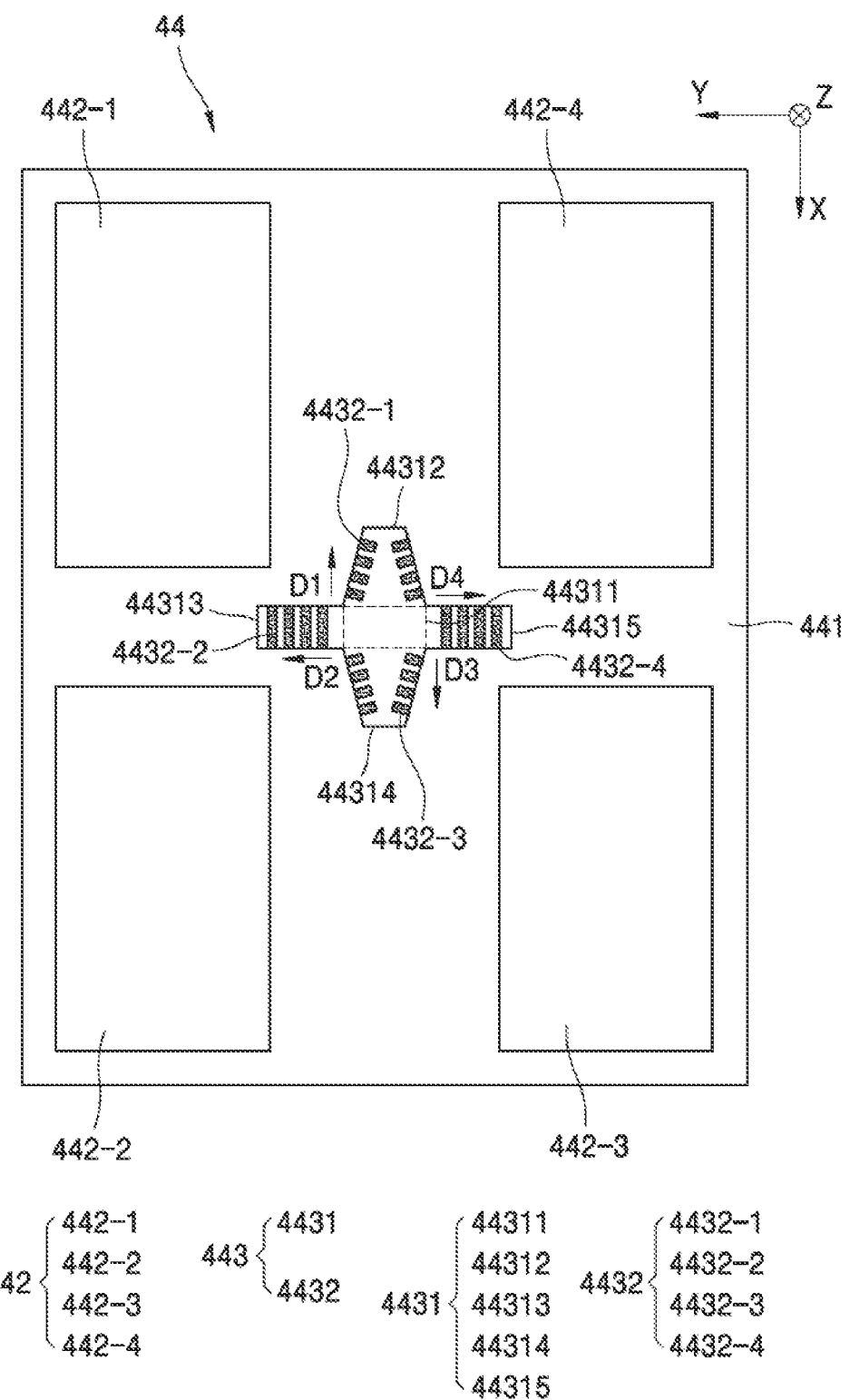

Referring to FIG. 4B, the correction member 4432 may be cut such that the deformation of the opening 442 is corrected. The correction member 4432 may be cut in a direction crossing with a direction in which the opening 442 inclines. For example, when the opening 442 is deformed as described with reference to FIG. 4A, the correction member 4432 may be cut in the first direction D1 and the third direction D3, which respectively cross with the second direction D2 and the fourth direction D4, as shown in FIG. 4B.

In this structure, the second correction member 4432-2 may cross the third hole 44313 and may be connected to the body 441, to thereby prevent or reduce the third hole 44313 from being widened. In some embodiments, the fourth correction member 4432-4 may cross the fifth hole 44315 and may be connected to the body 441, to thereby prevent or reduce the fifth hole 44315 from being widened. However, the first correction member 4432-1 may be cut, and the second hole 44312 may be widened in a direction crossing with the first direction D1. However, the third correction member 4432-3 may be cut, and the fourth hole 44314 may be widened in a direction crossing with the third direction D3. Accordingly, as the second hole 44312 and the fourth hole 44314 are widened, the shape of the opening 442 may be rectangular again.

Although FIG. 4B illustrates all of four first correction members 4432-1 in the second hole 44312 and four third correction members 4432-3 in the fourth hole 44314 are cut, this is merely an example, and the number of correction members 4432 being cut is not limited thereto. The number of correction members 4432 being cut may be determined in consideration of a desired or suitable degree by which a correction hole 4431 is widened.

Figure 5A:
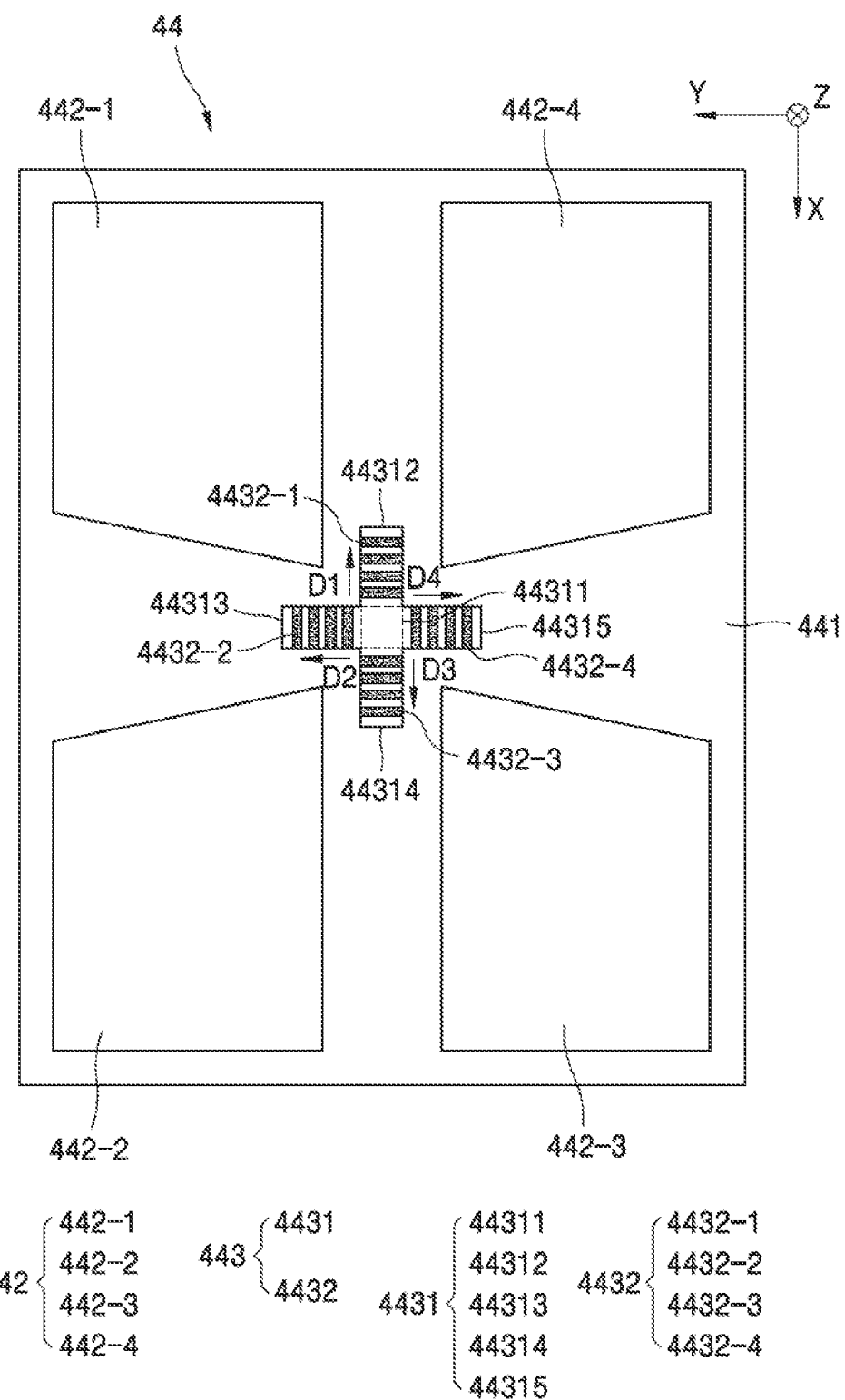

Referring to FIG. 5A, the opening 442 may be deformed such that a corner of the first opening 442-1 adjacent to the corrector 443 and a corner of the fourth opening 442-4 adjacent to the corrector 443 each incline in the third direction D3 toward the opening and a corner of the second opening 442-2 adjacent to the corrector 443 and a corner of the third direction D3 adjacent to the corrector 443 each incline in the first direction D1 toward the opening 442.

Figure 5B:
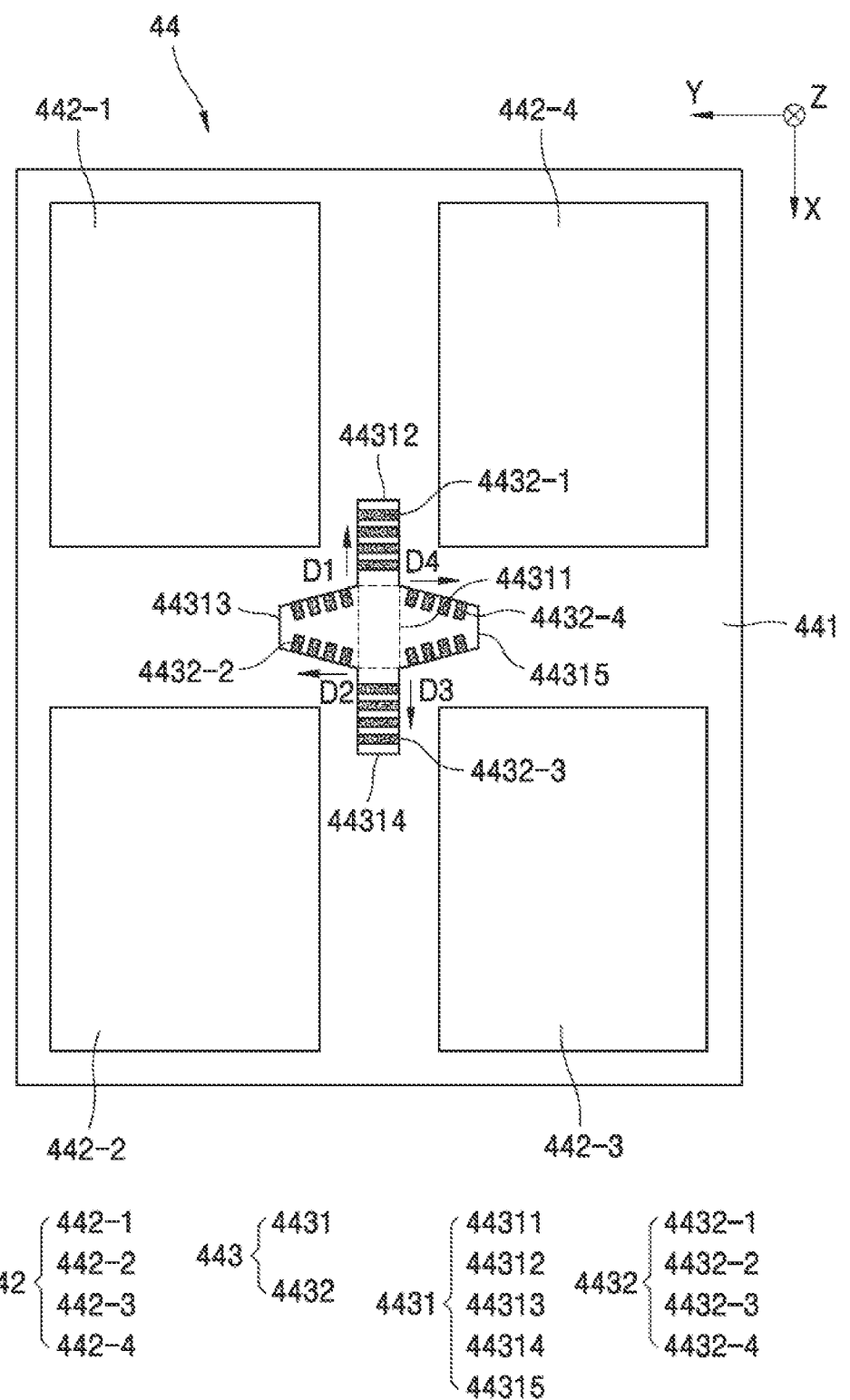

When the opening 442 is deformed as described with reference to FIG. 5A, the correction member 4432 may be cut in the second direction D2 and the fourth direction D4 respectively crossing with the first direction D1 and the third direction D3, as shown in FIG. 5B.

In this structure, the first correction member 4432-1 may cross the second hole 44312 and may be connected to the body 441, to thereby prevent or reduce the second hole 44312 from being widened. In some embodiments, the third correction member 4432-3 may cross the fourth hole 44314 and may be connected to the body 441, to thereby prevent or reduce the fourth hole 44314 from being widened. However, the second correction member 4432-2 may be cut, and the third hole 44313 may be widened in a direction crossing with the second direction D2. In some embodiments, the fourth correction member 4432-4 may be cut, and the fifth hole 44315 may be widened in a direction crossing with the fourth direction D4. Accordingly, as the third hole 44313 and the fifth hole 44315 are widened, the shape of the opening 442 may be rectangular again.

In addition to the shapes described with reference to FIGS. 4A to 5B, the opening 442 may be deformed in one or more suitable shapes. The corrector 443 may adjust positions and the number of the correction member 4432 being cut, and may correct deformation of the opening 442 in response to one or more suitable deformation of the opening 442.

Figure 6:
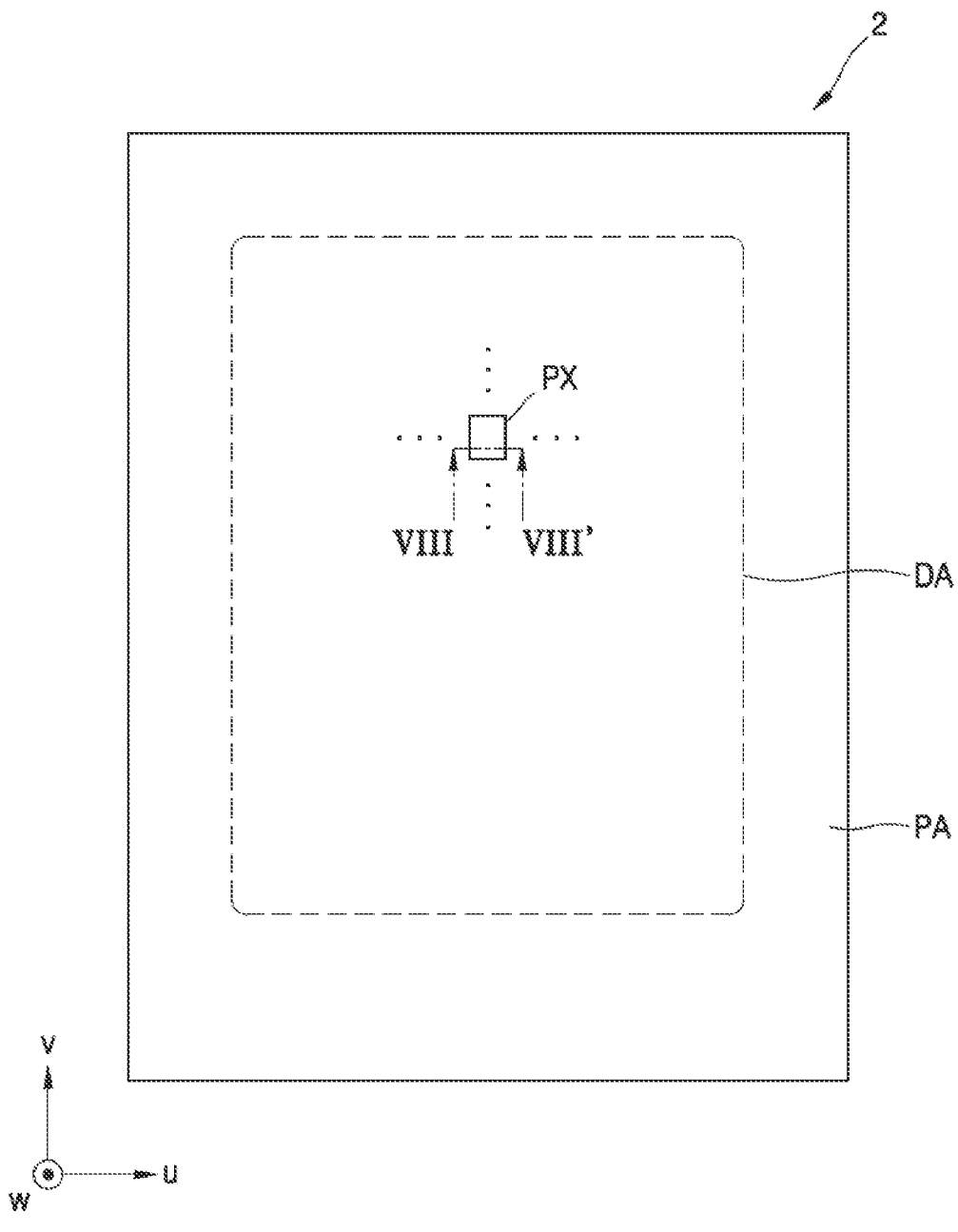
FIG. 6 is a schematic top plan view of a display device manufactured according to a method of manufacturing a display device, according to an embodiment.

FIG. 6 is a schematic top-plan view of a display device manufactured according to a method of manufacturing the display device, according to an embodiment.

Referring to FIG. 6, a display device 2 manufactured according to an embodiment may include a display area DA and a peripheral area PA arranged outside the display area DA. The display device 2 may provide images through an array of a plurality of pixels PX two-dimensionally arranged in the display area DA.

The peripheral area PA, which does not provide images, may completely or partially surround the display area DA. In the peripheral area PA, a driver and/or the like configured to provide electric signals or power to pixel circuits corresponding to the pixels PX may be arranged. A pad may be arranged in the peripheral area PA. The pad is an area to which an electronic device or a printed circuit board (PCB) and/or the like may be electrically connected.

Hereinafter, an example, in which the display device 2 includes an organic light-emitting diode OLED as a light-emitting element, but the display device 2 is not limited thereto. As another embodiment, the display device 2 may include a light-emitting display device including an inorganic light-emitting diode, that is, an inorganic light-emitting display. An inorganic light-emitting diode may include a PN (e.g., positive-negative) diode including inorganic semiconductor-based materials. Holes and electrons are injected into the PN diode when a voltage is applied to the PN diode in a positive direction, and energy generated by recombination of the holes and electrons may be converted into light energy to emit light having certain colors. The inorganic light-emitting diode described above may have a width of about several micrometers to hundreds of micrometers, and in some embodiments, the inorganic light-emitting diode may be referred to as a micro LED. As another embodiment, the display device 2 may include a quantum dot light-emitting display.

The display device 2 may be utilized as display screens for one or more suitable products such as televisions, notebooks, monitors, billboards, Internet of things (IOT) devices, as well as screens for mobile electronic devices such as mobile phones, smart phones, tablet personal computers, mobile terminals, electronic schedulers, electronic books, portable multimedia players, navigation devices, and ultra mobile PCs. In some embodiments, the display device 2 according to an embodiment may be utilized for wearable devices such as smart watches, watch phones, eye glasses-type or kind display devices, and head-mounted display (HMD) devices. In some embodiments, the display device 2 according to an embodiment may be utilized as a dashboard of a car, a center information display (CID) arranged on a center fascia or dashboard of a car, a room mirror display replacing a side mirror of a car, an entertainment for rear seats of a car, and a display screen arranged on a rear surface of a front seat.

Figure 7:
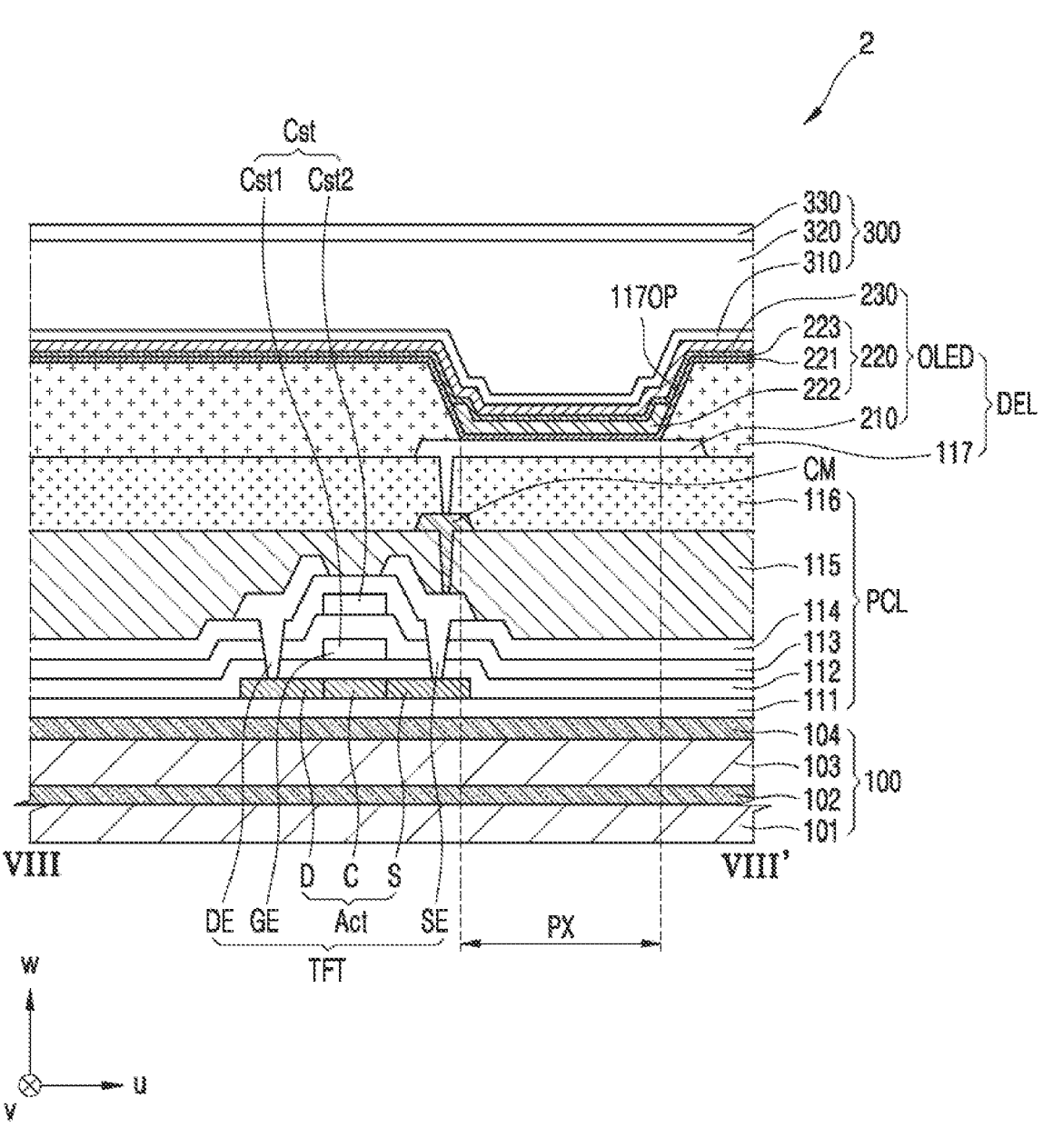
FIG. 7 is a schematic cross-sectional view of a display device manufactured according to a method of manufacturing a display device, according to an embodiment.

FIG. 7 is a schematic cross-sectional view of the display device manufactured according to the method of manufacturing the display device according to an embodiment, and may correspond to the cross-section of the display device taken along line VIII-VIII shown in FIG. 6.

Referring to FIG. 7, the display device 2 may include a stack structure including a substrate 100, a pixel circuit layer PCL, a display element layer DEL, and an encapsulation layer 300.

The substrate 100 may include a base layer and an inorganic layer, wherein the base layer includes a polymer resin. For example, the substrate 100 may include a base layer, which includes a polymer resin, and a barrier layer including an inorganic insulating layer. For example, the substrate 100 may include a first base layer 101, a first barrier layer 102, a second base layer 103, and a second barrier layer 104 sequentially stacked. The first base layer 101 and the second base layer 103 may include polyimide (PI), polyethersulfone (PES), polyarylate, polyetherimide (PEI), polyethylene naphthalate (PEN), polyethyleneterephthalate (PET), polyphenylene sulfide (PPS), polycarbonate, cellulose triacetate (TAC), cellulose acetate propionate (CAP), and/or the like. The first barrier layer 102 and the second barrier layer 104 may include an inorganic insulating material such as silicon oxide, silicon oxynitride, and/or silicon nitride. The substrate 100 may be flexible.

The pixel circuit layer PCL is disposed on the substrate 100. FIG. 12 illustrates that the pixel circuit layer PCL includes a thin-film transistor TFT, and a buffer layer 111, a first gate insulating layer 112, a second gate insulating layer 113, an interlayer insulating layer 114, a first planarization insulating layer 115, and a second planarization insulating layer 116 disposed under and/or above components of the thin-film transistor TFT.

The buffer layer 111 may reduce or prevent or reduce permeation of foreign materials, moisture, or external air from under the substrate 100, and may provide a plane on the substrate 100. The buffer layer 111 may include an inorganic insulating layer such as silicon oxide, silicon oxynitride, and/or silicon nitride, and may including a single layer or a multiple layer structure including one or more of the aforementioned materials.

The thin-film transistor TFT on the buffer layer 111 may include a semiconductor layer Act, and the semiconductor layer Act may include polysilicon. In some embodiments, the semiconductor layer Act may include amorphous silicon, an oxide semiconductor, an organic semiconductor, and/or the like. The semiconductor layer Act may include a channel area C, and a drain area D and the source area S respectively arranged at two sides of the channel area C. A gate electrode GE may overlap with the channel area C.

The gate electrode GE may include a low-resistance metal material. The gate electrode GE may include a conductive material including molybdenum (Mo), aluminum (Al), copper (Cu), titanium (Ti), and/or the like, and may include a multiple layer or a single layer including the aforementioned materials.

The first gate insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), and/or the like. $ZiO_x$ may include zinc oxide, and/or zinc peroxide ($ZnO_2$).

The second gate insulating layer 113 may be provided to cover the gate electrode GE. Similar to the first gate insulating layer 112, the second gate insulating layer 113 may include an inorganic insulating material such as $SiO_2$, $SiN_x$, SiON, $Al_2O_3$, $TiO_2$, $Ta_2O_5$, $HfO_2$, $ZnO_x$, and/or the like. Here, $ZnO_x$ may include or be zinc oxide, and/or zinc peroxide ($ZnO_2$).

An upper electrode Cst2 of a storage capacitor Cst may be disposed on the second gate insulating layer 113. The upper electrode Cst2 may overlap with the gate electrode GE thereunder. Here, the gate electrode GE and the upper electrode Cst2, overlapping each other with the second gate insulating layer 113 therebetween, may form the storage capacitor Cst. For example, the gate electrode GE may function as a lower electrode Cst1 of the storage capacitor Cst.

Like this, the storage capacitor Cst and the thin-film transistor TFT may overlap with each other. In some embodiments, the storage capacitor Cst may also not overlap with the thin-film transistor TFT.

The upper electrode Cst2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may include a single layer or a multiple layer including the aforementioned materials.

The interlayer insulating layer 114 may cover the upper electrode Cst2. The interlayer insulating layer 114 may include $SiO_2$, $SiN_x$, SiON, $Al_2O_3$, $TiO_2$, $Ta_2O_5$, $HfO_2$, $ZnO_x$, and/or the like. The $ZnO_x$ may include or be ZnO and/or $ZnO_2$. The interlayer insulating layer 114 may include a single layer or a multiple layer including the aforementioned inorganic insulating materials.

A drain electrode DE and a source electrode SE may be on the interlayer insulating layer 114, respectively. The drain electrode DE and the source electrode SE may be respectively connected to the drain area D and the source area S through contact holes formed in insulating layers under the drain electrode DE and the source electrode SE. The drain electrode DE and the source electrode SE may include highly conductive materials. The drain electrode DE and the source electrode SE may include conductive materials including Mo, Al, Cu, Ti, and/or the like, and may include a multiple layer or a single layer including the aforementioned materials. According to an embodiment, the drain electrode DE and the source electrode SE may each have a multiple-layer structure including Ti/Al/Ti.

The first planarization insulating layer 115 may cover the drain electrode DE and the source electrode. The first planarization insulating layer 115 may include an organic insulating material such as a general-purpose polymer such as polymethylmethacrylate (PMMA), polystyrene (PS), a polymer derivative having a phenolic group, an acryl-based polymer, an imide-based polymer, an arylether-based polymer, an amide-based polymer, a fluoropolymer, a p-xylene polymer, a vinylalcohol-based polymer, and/or one or more blends thereof.

The second planarization insulating layer 116 may be disposed on the first planarization insulating layer 115. The second planarization insulating layer 116 may include a same material as the first planarization insulating layer, and may include an organic insulating material such as a general-purpose polymer such as polymethylmethacrylate (PMMA), polystyrene (PS), a polymer derivative having a phenolic group, an acryl-based polymer, an imide-based polymer, an arylether-based polymer, an amide-based polymer, a fluoropolymer, a p-xylene polymer, a vinylalcohol-based polymer, and/or one or more blends thereof.

The display element layer DEL may be disposed on the pixel circuit layer PCL having the aforementioned structure. The display element layer DEL includes an organic light-emitting diode OLED as a display element (that is, a light-emitting device), and the organic light-emitting diode OLED may include a stack structure including a pixel electrode 210, an intermediate layer 220, and a common electrode 230 (e.g., stacked in this order). The organic light-emitting diode OLED may be configured to emit red, green, or blue light, or may be configured to emit red, green, blue, or white light. The organic light-emitting diode OLED may be configured to emit light through an emission area, and the emission area may be defined as a pixel PX.

The pixel electrode 210 of the organic light-emitting diode OLED may be electrically connected to the thin-film transistor TFT through contact holes formed in the second planarization insulating layer 116 and the first planarization insulating layer 115 and a contact metal CM disposed on the first planarization insulating layer 115.

The pixel electrode 210 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). As another embodiment, the pixel electrode 210 may include a reflective film including Ag, Mg, Al, Pt, Pd, Au, Ni, Nd, Ir, Cr, or one or more compounds thereof. As another embodiment, the pixel electrode 210 may further include a film including ITO, IZO, ZnO, or $In_2O_3$ above/under the reflective film described above.

A pixel defining film 117 having an opening 117OP is disposed above the pixel electrode 210. The opening 117OP exposes a center portion of the pixel electrode 210. The pixel defining film 117 may include an organic insulating material and/or an inorganic insulating material. The opening 117OP may define an emission area for light emitted from the organic light-emitting diode OLED. For example, a size/width of the opening 117OP may correspond to a size/width of the emission area. Accordingly, a size/width of the pixel PX may be dependent on the size/width of the opening 117OP of the pixel defining film 117 corresponding to the pixel PX.

The intermediate layer 220 may include an emission layer 222 corresponding to the pixel electrode 210. The emission layer 222 may include a high-molecular organic material or low-molecular organic material emitting light having certain colors. In some embodiments, the emission layer 222 may include an inorganic emission material or quantum dots.

In an embodiment, the intermediate layer 220 may include a first function layer 221 and a second function layer 223 disposed under and on the emission layer 222, respectively (e.g., the first functional layer 221/the emission layer 222/the second functional layer 223). The first function layer 221 may include, for example, a hole transport layer (HTL), or may include the HTL and a hole injection layer (HIL). As a component disposed on the emission layer 222, the second function layer 223 may include an electron transport layer (ETL) and/or an electron injection layer (EIL). The first function layer 221 and/or the second function layer 223 may be common layers to entirely cover the substrate 100, like the common electrode 230 to be described hereinafter.

The common electrode 230 may be disposed above the pixel electrode 210 and may overlap with the pixel electrode 210. The common electrode 230 may include a conductive material having a small work function. For example, the common electrode 230 may include a (semi) transparent layer including Ag, Mg, Al, Pt, Pd, Au, Ni, Nd, Ir, Cr, Li, Ca, or one or more alloys thereof. In some embodiments, the common electrode 230 may further include a layer including materials such as ITO, IZO, ZnO, or $In_2O_3$ on the (semi) transparent layer including the aforementioned materials. The common electrode 230 may be integrally formed to entirely cover the substrate 100.

The encapsulation layer 300 may be disposed on the display element layer DEL and may cover the display element layer DEL. The encapsulation layer 300 includes at least one inorganic encapsulation layer and at least one organic encapsulation layer, and as an embodiment, FIG. 12 illustrates that the encapsulation layer 300 includes a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include at least one inorganic material from (selected from) among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, polyethylene, and/or the like. As an embodiment, the organic encapsulation layer 320 may include acrylate. The organic encapsulation 320 may be formed by curing monomer or coating polymer. The organic encapsulation layer 320 may be transparent.

In some embodiments, a touch sensor layer may be disposed above the encapsulation layer 300, and an optical function layer may be above the touch sensor layer. The touch sensor layer may obtain coordinate information according to external inputs, for example, touch events. The optical function layer may reduce a reflectivity of light (external light) incident to the display device from the outside, and/or may improve color purity of the light emitted from the display device. As an embodiment, the optical function layer may include a retarder and/or a polarizer. The retarder may include a film type or kind or a liquid-crystal coating type or kind, and may include a $\lambda/2$ retarder and/or a $\lambda/4$ retarder. The polarizer may also include a film type or kind or a liquid crystal type or kind. The film type or kind may include a stretchable synthetic resin film, and the liquid-crystal coating type or kind may include liquid crystals in a certain arrangement. The retarder and the polarizer may further include a protective film.

An adhesion member may be disposed between the touch electrode layer and the optical function layer. Any adhesion members suitable in the field may be utilized without limitation as the adhesion member. The adhesion member may include a pressure-sensitive adhesive (PSA).

The display substrate DS described with reference to FIGS. 1 to 5A includes the substrate 100 shown in FIG. 7, and the deposition material M, which is deposited on the display substrate DS described with reference to FIGS. 1 to 5A, may include one of the pixel circuit layer PCL, the display element layer DEL, and/or the encapsulation layer 300.

Figure 8:
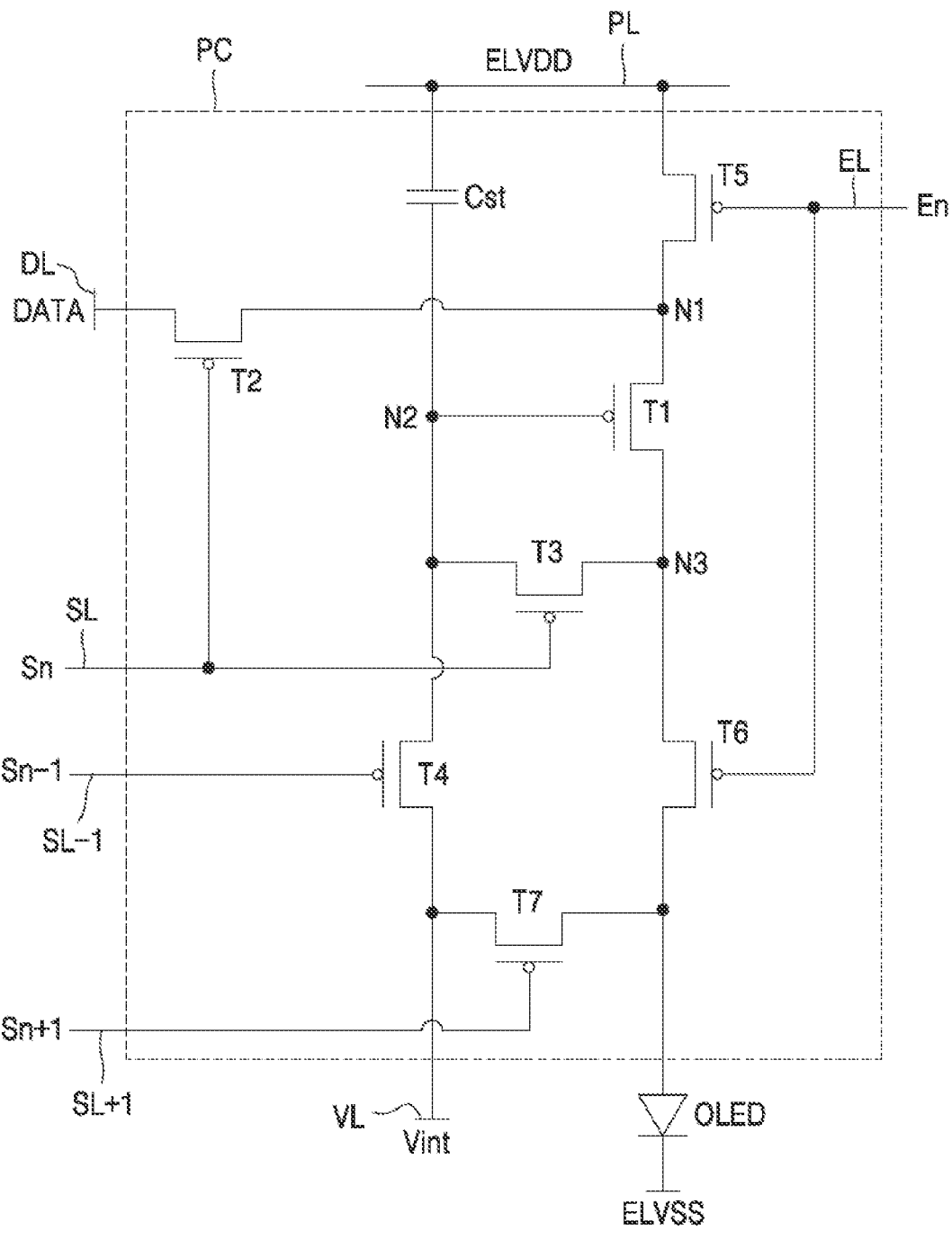
FIG. 8 is an equivalent circuit diagram of a pixel according to an embodiment.

FIG. 8 is an equivalent circuit diagram of a pixel according to an embodiment.

Referring to FIG. 8, the pixel circuit PC may include a first transistor T1 to a seventh transistor T7, and depending on type or kind and/or operation conditions of the transistors, a first terminal of each of the first transistor T1 to the seventh transistor T7 may include a source terminal or a drain terminal, and a second terminal may include a terminal different from the first terminal. For example, when the first terminal includes a source terminal, the second terminal may include a drain terminal.

The pixel circuit PC may be connected to: a first scan line SL configured to transmit a first scan signal Sn; a second scan line SL−1 configured to transmit a second scan signal Sn−1; a third scan line SL+1 configured to transmit a third scan signal Sn+1; an emission control line EL configured to transmit an emission control signal En; a data line DL configured to transmit a data signal DATA; a driving voltage line PL configured to transmit a driving voltage ELVDD; and an initialization voltage line VL configured to transmit an initialization voltage Vint.

The first transistor T1 includes a gate terminal connected to a second node N2, a first terminal connected to a first node n1, and a second terminal connected to a third node N3. The first transistor T1, which functions as a driving transistor, receives the data signal DATA in response to a switching operation of the second transistor T2 and provides a driving current to a light-emitting element. The emission device may include an organic light-emitting diode OLED.

The second transistor T2 (i.e., the switching transistor) includes a gate terminal connected to the first scan line SL, a first terminal connected to the data line DL, and a second terminal connected to the first node n1 (or the first terminal of the first transistor T1). The second transistor T2 may perform a switching operation of being turned on in response to the first scan signal Sn received through the first scan line SL and transmitting the data signal DATA, which is transmitted through the data line DL, to the first node N1.

The third transistor T3 (i.e., a compensation transistor) includes a gate terminal connected to the first scan line SL, a first terminal connected to the second node N2 (or the gate terminal of the first transistor T1), and a second terminal connected to the third node N3 (or the second terminal of the first transistor T1). The third transistor T3 may be turned on in response to the first scan signal Sn transmitted through the first scan line SL and have the first transistor T1 diode-connected. The third transistor T3 may have a structure in which two or more transistors are serially connected.

The fourth transistor T4 (i.e., a first initialization transistor) includes a gate terminal connected to the second scan line SL−1, a first terminal connected to the initialization voltage line VL, and a second terminal connected to the second node N2. The fourth transistor T4 may be turned on in response to the second scan signal Sn−1 delivered through the second scan line SL−1 and deliver the initialization voltage Vint to the gate terminal of the first transistor T1, to thereby initialize a gate voltage of the first transistor T1. The fourth transistor T4 may have a structure in which two or more transistors are serially connected.

The fifth transistor T5 (i.e., a first emission control transistor) includes a gate terminal connected to the emission control line EL, a first terminal connected to the driving voltage line PL, and a second terminal connected to the first node N1. The sixth transistor T6 (i.e., a second emission control transistor) includes a gate terminal connected to the emission control line EL, a first terminal connected to the third node N3, and a second terminal connected to the pixel electrode of the organic light-emitting diode OLED. As the fifth transistor T5 and the sixth transistor T6 are concurrently (e.g., simultaneously) turned on in response to the emission control signal En transmitted through the emission control line EL, a current flows through the organic light-emitting diode OLED.

The seventh transistor T7 (i.e., a second initialization transistor) includes a gate terminal connected to the third scan line SL+1, a first terminal connected to the second terminal of the sixth transistor T6 and the pixel electrode of the organic light-emitting diode OLED, and a second terminal connected to the initialization voltage line VL. The seventh transistor T7 may be turned on in response to the third scan signal Sn+1 delivered through the third scan line SL+1 and deliver the initialization voltage line Vint to the pixel electrode of the organic light-emitting diode OLED, to thereby initialize a voltage of the pixel electrode of the organic light-emitting diode OLED. The seventh transistor T7 may not be provided.

The capacitor Cst includes a first electrode connected to the second node N2 and a second electrode connected to the driving voltage line PL.

The organic light-emitting diode OLED may include a pixel electrode and a counter electrode facing the pixel electrode, and a common voltage ELVSS may be applied to the counter electrode. The organic light-emitting diode OLED may display images by receiving the driving current from the first transistor T1 and emitting light having certain colors. The counter electrode may be provided in common, that is, integrally, in the plurality of pixels.

According to embodiments, a deposition material may be deposited on accurate positions on the display substrate by correcting the deformation of the opening caused in the process during which the mask sheet is stretched.

Aspects, features, and advantages other than the descriptions will be clearly understood from the following drawings, claims, and detailed descriptions.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A method of manufacturing a display device, the method comprising:

applying a manufactured mask assembly to a supporter;

depositing a deposition material on a display substrate through the mask assembly, wherein the mask assembly is manufactured by:

arranging an opening and a corrector in a body of a mask sheet;

fixing the mask sheet to a mask frame by stretching the body; and correcting, by the corrector, of deformation of the opening, the corrector comprising a correction hole and a correction member.

2. A method of manufacturing a display device, the method comprising:

applying a manufactured mask assembly to a supporter;

depositing a deposition material on a display substrate through the mask assembly wherein the mask assembly is manufactured by:

arranging an opening and a corrector in a body of a mask sheet; and fixing the mask sheet to a mask frame by stretching the body; and correcting, by the corrector, of deformation of the opening, and wherein the correcting, by the corrector, of the deformation of the opening comprises:

cutting at least a portion of the corrector.

3. The method of claim 2, wherein the corrector comprises a correction hole penetrating the body; and a correction member crossing at least a portion of the correction hole and being cuttably connected to the body.

4. The method of claim 3, wherein the correction hole comprises a first hole;

a second hole extending in a first direction from the first hole; and a third hole extending in a second direction from the first hole.

5. The method of claim 4, wherein the first direction and the second direction cross each other.

6. The method of claim 5, wherein the correction member comprises:

a first correction member crossing the second hole; and a second correction member crossing the third hole.

7. The method of claim 3, wherein the correction hole has a cross shape in a plan view of the correction hole.

8. The method of claim 3, wherein a thickness of the correction member is smaller than a thickness of the body.

9. The method of claim 1, wherein the opening is provided as a plurality of openings, the plurality of openings are arranged in a first opening direction and a second opening direction crossing the first opening direction, and at least a portion of the corrector is in an area of four openings adjacent to one another selected from among the plurality of openings.

\* \* \* \* \*